US007362249B2

(12) United States Patent
Kim et al.

(10) Patent No.: US 7,362,249 B2
(45) Date of Patent: Apr. 22, 2008

(54) CURRENT RANGE CONTROL CIRCUIT, DATA DRIVER, AND ORGANIC LIGHT EMITTING DISPLAY

(75) Inventors: Yang Wan Kim, Seoul (KR); Oh Kyong Kwon, Seoul (KR)

(73) Assignee: Samsung SDI Co., Ltd. (KR)

( * ) Notice: Subject to any disclaimer, the term of this patent is extended or adjusted under 35 U.S.C. 154(b) by 162 days.

(21) Appl. No.: 11/283,543

(22) Filed: Nov. 18, 2005

(65) Prior Publication Data

US 2006/0132398 A1 Jun. 22, 2006

(30) Foreign Application Priority Data

Nov. 23, 2004 (KR) ...................... 10-2004-0096376

(51) Int. Cl.
*H03M 1/00* (2006.01)
*G06F 3/38* (2006.01)

(52) U.S. Cl. ...................... 341/139; 341/135; 341/144; 345/204; 345/501; 345/504

(58) Field of Classification Search ................ 345/504, 345/505, 204–207; 341/144–154
See application file for complete search history.

(56) References Cited

U.S. PATENT DOCUMENTS 6,320,566 B1 11/2001 Go
6,707,437 B1 * 3/2004 Kuno et al. ................ 345/74.1
6,744,414 B2 6/2004 Lee et al.
6,816,144 B2 * 11/2004 Tsuchi ........................ 345/100
7,012,597 B2 * 3/2006 Kasai ......................... 345/204
7,180,514 B2 * 2/2007 Kuno et al. ................. 345/211
7,224,303 B2 * 5/2007 Kwon ........................ 341/144
7,239,567 B2 * 7/2007 Kwon ........................ 365/203
2003/0040149 A1 * 2/2003 Kasai ......................... 438/200
2003/0112228 A1 * 6/2003 Gillespie et al. ............ 345/173
2004/0104830 A1 * 6/2004 May ........................... 341/144
2005/0168416 A1 * 8/2005 Hashimoto et al. ........... 345/76
2006/0077077 A1 * 4/2006 Kwon ......................... 341/50
2006/0077137 A1 * 4/2006 Kwon ......................... 345/76
2006/0077139 A1 * 4/2006 Kwon ......................... 345/76

* cited by examiner

*Primary Examiner*—Linh Nguyen
(74) *Attorney, Agent, or Firm*—Knobbe, Martens, Olson & Bear LLP

(57) ABSTRACT

Embodiments of a current range control circuit, data driver and organic light emitting display are disclosed, wherein the current range control circuit is configured to adjust a range of an input current in the data driver according to a type of display device. One embodiment of the data driver comprises a data latch configured to sequentially receive video data according to a latch control signal and output the video data in parallel. A multiplexer multiplexes the outputted video data, and a D/A converter converts the multiplexed video data into analog current signals. The data driver further comprises a current range control circuit configured to receive data current signals from the D/A converter and output a demultiplexed data current. The current range control circuit is further configured to adjust a range of the data current according to a current range control signal.

9 Claims, 4 Drawing Sheets

CURRENT RANGE CONTROL CIRCUIT, DATA DRIVER, AND ORGANIC LIGHT EMITTING DISPLAY

CROSS-REFERENCE TO RELATED APPLICATIONS

This application claims the benefit of Korean Patent Application No. 10-2004-096376, filed on Nov. 23, 2004, in the Korean Intellectual Property Office, the disclosure of which is incorporated herein by reference.

BACKGROUND

1. Field of the Invention

The present invention relates generally to a current range control circuit, data driver, and organic light emitting display. More particularly, the invention relates to a current range control circuit configured to adjust a range of an input current, and a data driver and organic light emitting display employing the control circuit.

2. Discussion of Related Technology

Various panel display devices with reduced weight and volume as compared to cathode ray tube (CRT) display devices have recently been developed. Such panel display devices include Liquid Crystal Displays (LCDs), Field Emission Displays (FEDs), Plasma Display Panels (PDPs), and organic light emitting displays.

Among panel displays, organic light emitting displays are spontaneous emission devices that emit light by recombination of electrons and holes. Organic light emitting displays may also be referred to as organic electroluminescent displays. Like CRT display devices, organic light emitting displays have a high response speed compared with passive electroluminescent devices that require an additional light source, such as an LCD.

An organic light emitting display is driven by either a passive matrix method or an active matrix method. According to the active matrix driving method, the amount of current that flows through an electroluminescent device is controlled by an active device. Typically, a thin film transistor (TFT) is employed as the active device. The active matrix method is complicated, however it is advantageous in that the power consumption is small and emission time is long.

An organic light emitting display may employ a voltage programming method or a current programming method. According to the voltage programming method, a data driver outputs a voltage corresponding to a data signal, a capacitor of a pixel circuit stores the voltage corresponding to the output voltage, and an electroluminescent device emits light in response to the stored voltage. According to the voltage programming method, an LCD data driver may be used. However, it is difficult to obtain a uniform display using the LCD data driver due to deviations between the threshold voltage and mobility of the TFT used as the active device.

Using the current programming method, the deviation of the threshold voltage and mobility of the TFT are easily compensated for and thus a uniform display is obtained. Therefore, development of a data driver for outputting data current would be advantageous.

However, in the data driver of the current programming method, the range of the data currents may vary for different pixel circuits. For a pixel circuit that transmits current whose magnitude is equal to the magnitude of the data currents, the required range of the data currents is not large. However, when the data currents are multiples M of the current that flows through the electroluminescent device by using an M:1 mirror, the range of the data currents is large. Furthermore, since luminous efficiency varies with the type of electroluminescent device, the range of data currents required by the device may vary. Thus, because the required ranges of data current varies with the type of pixel circuit or the type of electroluminescent device, a particular data driver must be designed for each pixel circuit or each electroluminescent device.

SUMMARY OF CERTAIN INVENTIVE EMBODIMENTS

Embodiments of the invention include a current range control circuit, data driver, and organic light emitting display configured to adjust a range of a data current value.

One embodiment of a data driver comprises a shift register configured to output a latch control signal according to a clock signal and a synchronous signal, a data latch configured to sequentially receive video data according to the latch control signal and to output the video data in parallel. The data driver further comprises a multiplexer configured to multiplex the parallel video data, a digital-to-analog (D/A) converter configured to convert the multiplexed video data to analog data current, and a current range control circuit configured to receive the analog data current from the D/A converter and output a demultiplexed data current, wherein the current range control circuit is configured to adjust a range of the data current according to a current range control signal.

One embodiment of an organic light emitting display comprises a scan driver configured to sequentially supply a scan signal to a plurality of scan lines, a data driver according to the above-described embodiment, and a pixel portion configured to display an image according to the data current supplied to the plurality of data lines and the scan signal supplied to the plurality of scan lines.

One embodiment of a current range control circuit comprises an input mirror circuit comprising a first transistor, wherein a drain and a gate of the first transistor are commonly connected, and wherein the analog data current is drawn from a drain of the first transistor. The current range control circuit further comprises a master circuit configured to store a voltage supplied to the gate of the first transistor and to output a master current corresponding to the stored voltage value according to a master sample and hold control signal, wherein a range of the master current is controlled by the current range control signal. The current range control circuit also comprises a slave circuit configured to store a voltage supplied to the gate of the first transistor and to output a slave current corresponding to the stored voltage value according to a slave sample and hold control signal, wherein a range of the slave current is controlled by the current range control signal. The current range control circuit further comprises a master/slave selection circuit configured to select and output one of the master current and the slave current as a data current according to a master/slave selection circuit.

Another embodiment of a current range control circuit comprises an input mirror circuit comprising a first transistor, wherein a drain and a gate of the first transistor are commonly connected and an input current is drawn from a drain of the first transistor. The current range control circuit further comprises an operational amplifier, wherein the operational amplifier forms a negative feedback loop comprising a positive input terminal of the operational amplifier connected to the drain of the first transistor. The current range control circuit also comprises a master circuit configured to store a voltage supplied to the gate of the first transistor and to output a master current corresponding to the stored voltage according to a master sample and hold control signal, wherein a range of the master current is controlled by the current range control signal. The current range control circuit further comprises a slave circuit configured to store a voltage supplied to the gate of the first transistor and to output a slave current corresponding to the stored voltage according to a slave sample and hold control signal, wherein a range of the slave current is controlled by the current range control signal. The current range control circuit also comprises a master/slave selection circuit configured to output one of the master current and the slave current as a data current according to a master/slave selection signal.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Figure 1:
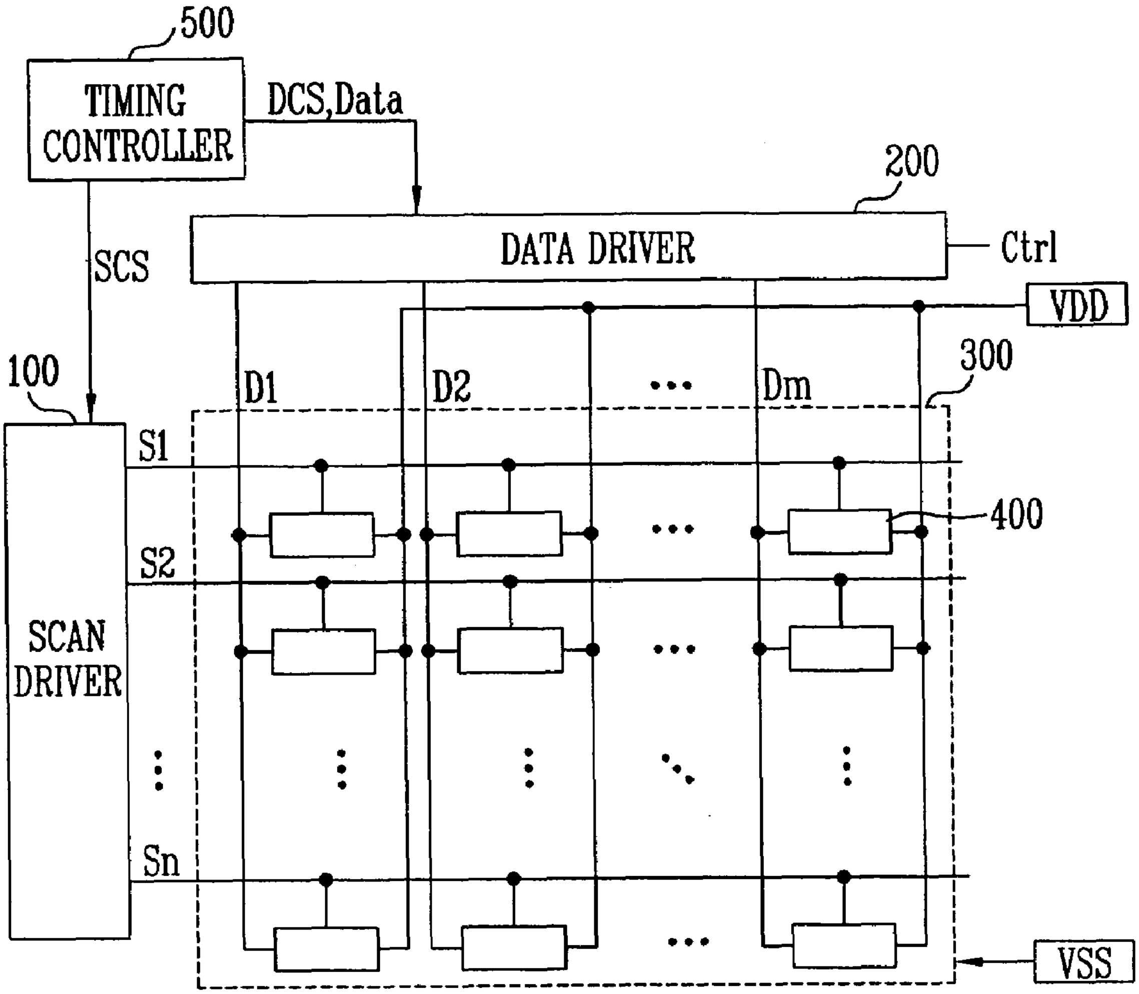
FIG. 1 is a block diagram of one embodiment of an organic light emitting display.

FIG. 1 is a block diagram of one embodiment of an organic light emitting display. As shown in FIG. 1, the organic light emitting display comprises a scan driver 100, a data driver 200, a pixel portion 300 and a timing controller 500. The timing controller 500 is configured to supply a control signal SCS to the scan driver 100, and a control signal DCS and video data (Data) to the data driver 200.

The scan driver 100 is configured to drive a plurality of scan lines S1 to Sn. The scan driver 100 is configured to generate a scan signal according to the control signal SCS from the timing controller 500, and to supply the generated scan signal to the scan lines S1 to Sn.

The data driver 200 is configured to drive a plurality of data lines D1 to Dm. More particularly, the data driver 200 is configured to generate a plurality of data currents according to the control signal DCS and the video data 'Data' from the timing controller 500, and to supply the generated data currents to the data lines D1 to Dm. A range of an output current from the data driver 200 is adjustable according to a current range control signal Ctrl.

The pixel portion 300 comprises a plurality of pixels 400, wherein individual pixels are defined by the scan lines S1 to Sn and the data lines D1 to Dm. The pixel portion 300 receives a first supply voltage VDD and a second supply voltage VSS from external sources (not shown). In one embodiment, the first supply voltage VDD and the second supply voltage VSS are supplied to respective pixels 400, and pixels 400 display an image according to data currents supplied from the data driver 200.

Figure 2:
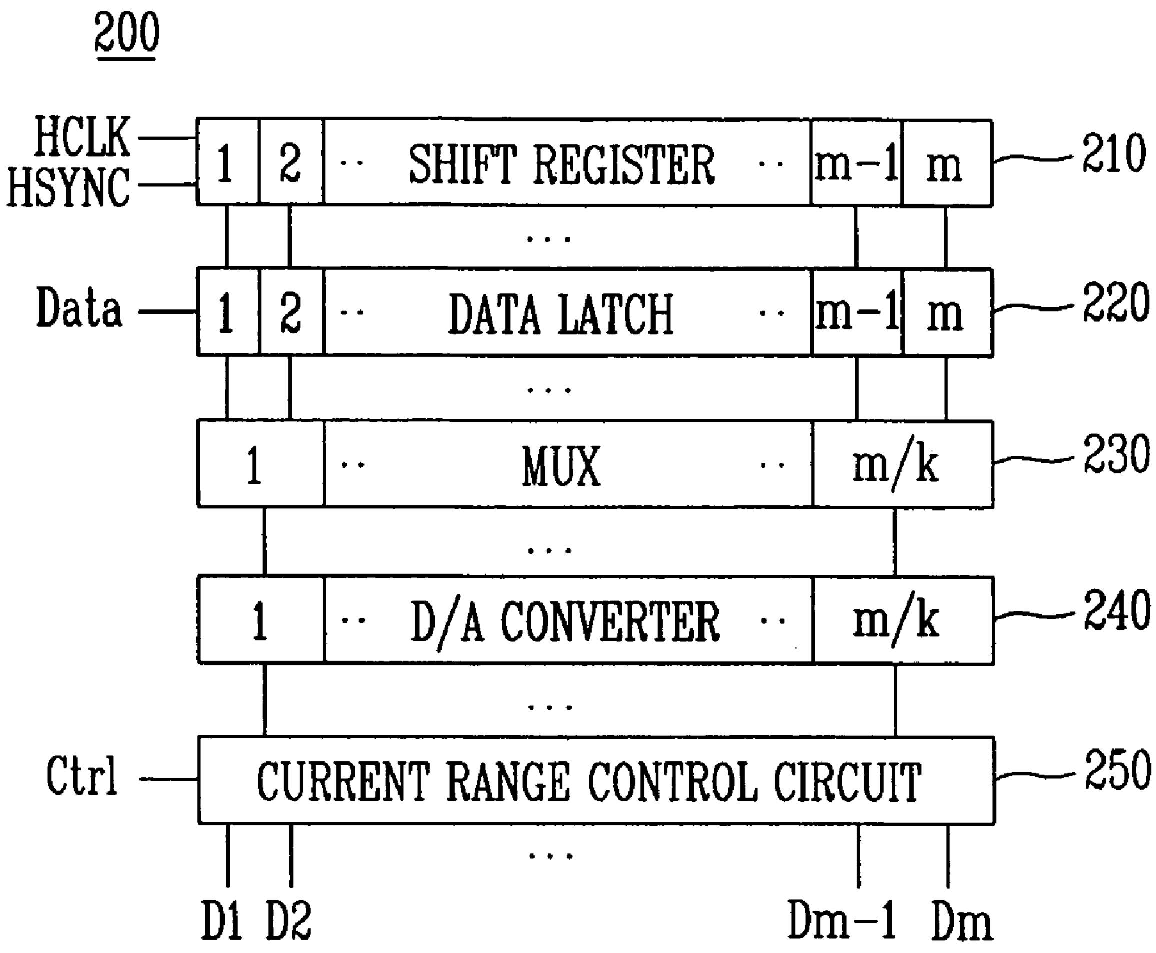
FIG. 2 shows is a block diagram of an embodiment of a data driver for implementation in the organic light emitting display of FIG. 1.

FIG. 2 is a block diagram of one embodiment of the data driver 200 for implementation in the organic light emitting display of FIG. 1. As shown in FIG. 2, the data driver 200 comprises a shift register 210, a data latch 220, a multiplexer 230, a digital-to-analog (D/A) converter 240, and a current range control circuit 250.

The shift register 210 is configured to control the data latch 220 according to a horizontal clock signal HCLK and a horizontal synchronous signal HSYNC. The horizontal clock signal HCLK and the horizontal synchronous signal HSYNC are generated in response to the control signal DCS from the timing controller 500 (see FIG. 1).

The data latch sequentially receives the video data 'Data' and outputs the same to the multiplexer 230 in parallel. The data latch 220 is controlled by a control signal from the shift register 210. The video data 'Data' may comprise, for example, data corresponding to a blue color, green color and red color or blue color, green color, red color and white color. In one embodiment, the data latch 220 comprises a sampling latch (not shown), which sequentially receives the video data 'Data' according to the control signal from the shift register 210 and outputs the same in parallel, and a holding latch (not shown), which receives the video data 'Data' from the sampling latch and maintains or holds the data for the duration of one frame.

The multiplexer 230 is configured to multiplex the video data 'Data' from the data latch 220 at a ratio of k:1 (wherein k is an integer greater than two), and then outputs the multiplexed video data 'Data' to the D/A converter 240.

The D/A converter 240 is configured to convert the multiplexed video data to analog current signals and output the same.

The current range control circuit 250 is configured to demultiplex the analog current signals from the D/A converter 240 at a ratio of 1:k. The current range control circuit 250 is configured to output data current signals, adjusted according to the current range control signal Ctrl, to data lines (D1 to Dm). In one embodiment, a current level which is output from the current range control circuit 250 is proportional to a current level which is output from the D/A converter 240, wherein the proportionality constant is determined by the current range control signal Ctrl.

In one embodiment, the current range control circuit 250 is configured to output current at a level 2× the current level of signals which are output from the D/A converter 240 in response to the current range control signal Ctrl corresponding to a first mode, to output current at a level 1.5× the current level of signals which are output from the D/A converter 240 in response to the current range control signal Ctrl corresponding to a second mode, to output current at a level equal to the current level of signals which are output from the D/A converter 240 in response to the current range control signal Ctrl corresponding to a third mode, and to output 0.5× the current level of signals which are output from the D/A converter 240 in response to the current range control signal Ctrl corresponding to a fourth mode.

The data driver 200 thereby outputs data current corresponding to the video data 'Data' to the data lines D1 to Dm according to the current range control circuit 250 as described in reference to FIG. 2, wherein the data driver 200 is able to adjust a range of the data current in response to the current range control signal Ctrl. In certain embodiments, the structure of the D/A converter 240 is simplified by using the multiplexer 230.

Figure 3:
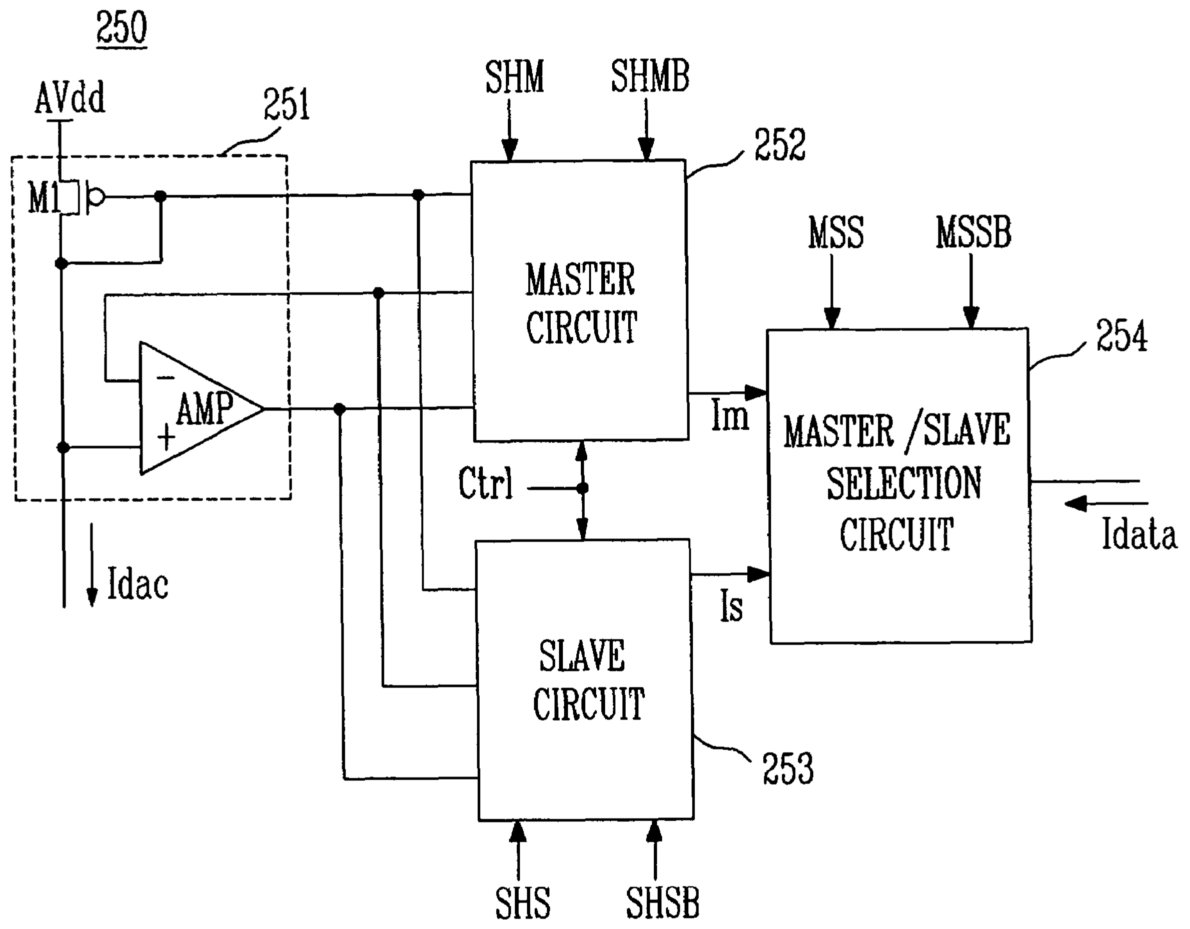
FIG. 3 is a block diagram of an embodiment of a current range control circuit for implementation in the data driver of FIG. 2.

FIG. 3 is a block diagram of one embodiment of the current range control circuit 250 for implementation in the data driver 200 of FIG. 2. As shown in FIG. 3, the current range control circuit 250 comprises an input mirror circuit 251, a master circuit 252, a slave circuit 253 and a master/slave selection circuit 254.

The input mirror circuit 251 comprises a first transistor M1 and an operational amplifier AMP. A first supply voltage AVdd is supplied to a source of the first transistor M1, and the first transistor M1 includes a drain and a gate which are commonly connected. A current Idac is drawn from the common drain/gate connection of the first transistor M1. The gate of the first transistor M1 is also connected to the master circuit 252 and the slave circuit 253. In the illustrated and described embodiment, the first transistor M1 is a p-channel metal oxide semiconductor (PMOS) field-effect transistor (FET). However, as will be appreciated by those skilled in the technology, other types of transistors may be used in other embodiments.

The operational amplifier AMP, as an additional circuit component, forms a negative feedback loop together with third transistors (not shown) internal to the master circuit 252 and the slave circuit 253. The operational amplifier AMP equalizes a drain voltage of the first transistor M1 with respective drain voltages of a plurality of second transistors (not shown) internal to the master circuit 252 and the slave circuit 253. A positive terminal (+) of the operational amplifier AMP is coupled to the drain of the first transistor M1, a negative terminal (−) of the operational amplifier AMP is connected to respective drains of the plurality of second transistors via a switch. An output terminal of the operational amplifier AMP is connected to respective gates of the plurality of third transistors via a switch.

The master circuit 252 is configured to store a voltage in a capacitor (not shown) according to master sample and hold control signals (SHM, SHMB), wherein the voltage is supplied from the gate of the first transistor M1 and the output terminal of the operational amplifier AMP. The master circuit 252 is further configured to output a master current Im corresponding to the stored voltage. In one embodiment, a current level range of the master current Im is controlled by the current range control signal Ctrl.

Similar to the master circuit 252, the slave circuit 253 is configured to store a voltage in a capacitor (not shown) according to a slave sample and hold control signal (SHS, SHSB), wherein the voltage is supplied from the gate of the first transistor M1 and the output terminal of the operational amplifier AMP. The slave circuit 253 is further configured to output a slave current Is corresponding to the stored voltage. In one embodiment, a current level range of the slave current Is is controlled by the current range control signal Ctrl.

The master/slave selection circuit 254 is configured to output one of the master current Im and the slave current Is as a data current Idata according to a master/slave selection signal (MSS, MSSB).

The current range control circuit 250 is thus able to output the demultiplexed data current Idata in response to the output current from the D/A converter 240, and to control a range of the data current Idata as described above. In one embodiment, the accuracy of current values is improved by reconciling drain voltages of the plurality of second transistors, internal to the master and slave circuits 252, 253, with a drain voltage of the first transistor M1. This equalization may be achieved by including the plurality of third transistors internal to the master and slave circuits 252, 253 and the operational amplifier AMP, wherein the operational amplifier AMP is connected in series with the plurality of second transistors.

Figure 4:
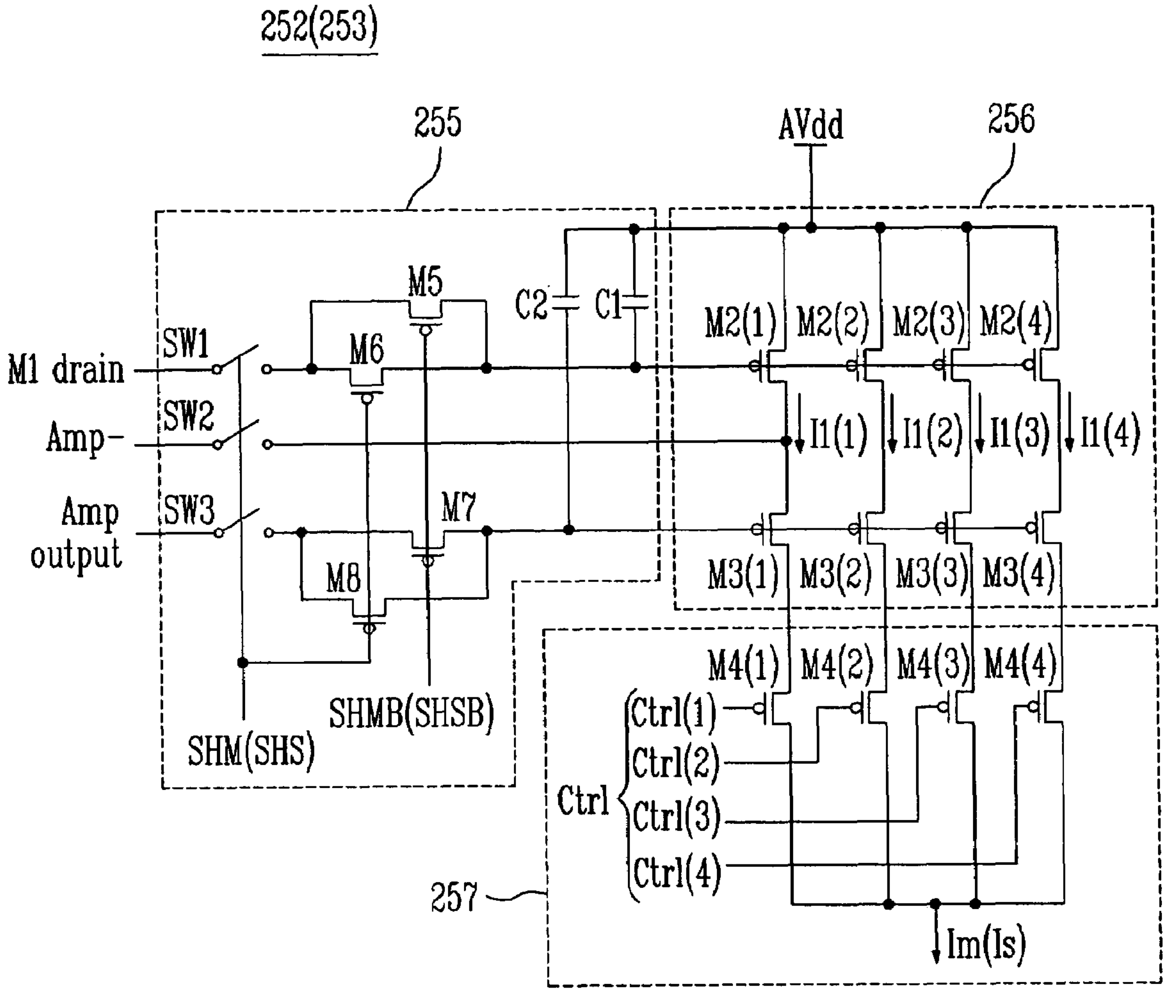
FIG. 4 is a block diagram of an embodiment of a master circuit or a slave circuit for implementation in the current range control circuit of FIG. 3.

FIG. 4 is a block diagram of one embodiment of the master circuit 252 (or the slave circuit 253) for implementation in the current range control circuit 250 of FIG. 3. As shown in FIGS. 3 and 4, the master circuit 252 (or the slave circuit 253) comprises a sample and hold circuit 255, an output mirror circuit 256, and a switch circuit 257. The output mirror circuit 256 comprises a plurality of second transistors (M2(1) to M2(4)) and a plurality of third transistors (M3(1) to M3(4)).

The sample and hold circuit 255 comprises a plurality of switches (SW1 to SW3), a plurality of capacitors (C1, C2), and a plurality of noise controlling transistors (M5 to M8). The first switch SW1 is connected to the drain of the first transistor M1 and the first capacitor C1. The first capacitor selectively stores the gate voltage of the first transistor M1 according to the sample and hold control signal (SHM, SHMB or SHS, SHSB), and then maintains the stored gate voltage.

The plurality of noise controlling transistors (M5 to M8)are configured to prevent noise (such as a kick back phenomenon) generated by an operation of the switches (SW1, SW2 and SW3). The noise controlling transistors (M5, M6) are connected with each other in parallel and are connected between the first switch SW1 and gates of the plurality of second transistors (M2(1) to M2(4)), wherein any one of the noise controlling transistors (M5, M6) is driven so as to maintain an ON-state according to the sample and hold control signal (SHM, SHMB or SHS, SHSB). Similarly, the noise controlling transistors (M7, M8) are connected between the third switch SW3 and gates of the plurality of third transistors (M3(1) to M3(4)) and are connected with each other in parallel, wherein any one of the noise controlling transistors (M7, M8) is driven so as to maintain an ON-state according to the sample and hold control signal (SHM, SHMB or SHS, SHSB).

As discussed above, the output mirror circuit 256 comprises the plurality of second transistors (M2(1) to M2(4)) and the plurality of third transistors (M3(1) to M3(4)). The first supply voltage AVdd is supplied to respective sources of the second transistors (M2(1) to M2(4)), and gates of the second transistors (M2(1) to M2(4)) are connected to the first capacitor C1 in a series configuration.

The plurality of second transistors (M2(1) to M2(4)) indirectly form a current mirror together with the first transistor M1 via the first capacitor C1 and the first switch SW1. Thus, first currents (I1(1) to I1(4)) flowing through the respective transistors (M2(1) to M2(4)) are proportional to a current Idac, wherein the proportionality is determined by the ratio of the width to the length in channels of the transistors (M2(1) to M2(4)) and the ratio of the width to the length in a channel of the first transistor M1. Thereby, the output mirror circuit 256 supplies the first currents (I1(1) to I1(4)), proportional to the current Idac which flows into the first transistor M1, to the switch circuit 257.

The plurality of third transistors (M3(1) to M3(4)) form a negative feedback loop together with the operational amplifier AMP and the switches (SW2, SW3) so as to equalize a drain voltage of the first transistor M1 with drain voltages of the plurality of second transistors (M2(1) to M2(4)). For example, the output voltage (Amp output) for the operational amplifier AMP may drop when a drain voltage of one of the second transistors (M2(1) to M2(4)) is greater than a drain voltage of the first transistor M1. Accordingly, negative feedback is generated when drain voltages of the plurality of second transistors (M2(1) to M2(4)) are reduced because a current driving ability of the plurality of third transistors (M3(1) to M3(4)) is reduced.

The current flowing through a transistor is affected by the voltage between a drain and a source of the transistor as well as a voltage between a gate and a source of the transistor. Accordingly, the first currents (I1(1) to I1(4)) which flow through the plurality of second transistors (M2(1) to M2(4)) equal or proportional to a current flowing through the first transistor M1 if drain voltages of the plurality of second transistors (M2(1) to M2(4)) are equalized with a drain voltage of the first transistor M1.

Gate voltages of the plurality of third transistors (M3(1) to M3(4)) are stored in the second capacitor C2 by operation of the negative feedback loop when the switches SW2, SW3 are in an ON-state (closed), wherein the stored voltages are configured to equalize a drain voltage of the first transistor M1 with drain voltages of the plurality of second transistors (M2(1) to M2(4)). The voltage of the second capacitor C2 is maintained during a period when the switches SW2, SW3 are in an OFF-state (open).

Respective sources of the plurality of third transistors (M3(1) to M3(4)) are connected to respective drains of the plurality of second transistors (M2(1) to M2(4)), and the drains of the plurality of third transistors (M3(1) to M3(4)) are connected to the switching circuit 257.

The switching circuit 257 comprises a plurality of fourth transistors M4(1) to M4(4). Sources of the fourth transistors (M4(1) to M4(4)) are connected to the output mirror circuit 256 and receive the first currents (I1(1) to I1(4)) which are output from the output mirror circuit 256. The gates of the fourth transistors (M4(1) to M4(4)) receive the current range control signals Ctrl(1) to Ctrl(4), and the fourth transistors (M4(1) to M4(4)) selectively supply the first currents (I1(1) to I1(4)) according to the current range control signals (Ctrl(1) to Ctrl(4)). The drains of the fourth transistors (M4(1) to M4(4)) are coupled together to output a sum of the supplied currents as a master current Im (or a slave current Is). Thus, the switching circuit 257 selects one or more current signals outputted from the output mirror circuit 256 according to the current range control signals (Ctrl(1) to Ctrl(4)) and outputs a sum of the selected supplied current as a master current Im (or a slave current Is).

In one embodiment, the switching circuit 257 is configured such that a low level voltage is supplied to a gate of one of the fourth transistors (M4(1) to M4(4)) to thereby always maintain an ON-state, and the current range control signal Ctrl is only supplied to the other transistors not receiving the low level voltage.

In certain embodiments, transistor channel widths of the respective plurality of second transistors (M2(1) to M2(4)) are identical and transistor channel lengths of the respective plurality of second transistors (M2(1) to M2(4)) are identical. In some embodiments, transistor channel widths of the respective plurality of third transistors (M3(1) to M3(4)) are identical, and transistor channel lengths of the respective plurality of third transistors (M3(1) to M3(4)) are identical.

In the above-described embodiment of the master and slave circuits, the transistors are PMOSFET's. However, as will be appreciated by those skilled in the technology, the circuits may be configured with other types of transistors or combinations of types of transistors.

Embodiments of the above-described current range control circuit, data driver, and organic light emitting display can advantageously be implemented in various types of pixel circuits and light emitting devices because the range of a device input current is adjustable as outputted from the data driver according to a current range control signal.

In addition, embodiments of the current range control circuit, data driver, and organic light emitting display are also configured to provide a precise current value by reconciling drain voltage values of transistors forming a mirror circuit. In some embodiments, the complexity of a D/A converter employed in a current range control circuit, data driver, and organic light emitting display is reduced.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A data driver comprising:

a shift register configured to output a latch control signal according to a clock signal and a synchronous signal;

a data latch configured to sequentially receive video data according to the latch control signal, and to output the video data in parallel;

a multiplexer configured to multiplex the parallel video data;

a digital-to-analog (D/A) converter configured to convert the multiplexed video data to multiplexed analog current, and to output multiplexed data current; and a current range control circuit configured to receive the multiplexed data current from the D/A converter and to output demultiplexed data current, wherein the current range control circuit is further configured to adjust a range of the data current according to a current range control signal, the current range control circuit comprising:

an input mirror circuit comprising a first transistor, wherein a drain of the first transistor is coupled to a gate of the first transistor, and wherein the multiplexed data current is drawn from the drain of the first transistor;

a master circuit configured to store a voltage from the gate of the first transistor according to a master sample and hold control signal, and to output a master current corresponding to the stored voltage value, wherein a range of the master current is controlled by the current range control signal;

a slave circuit configured to store a voltage from the gate of the first transistor according to a slave sample and hold control signal, and to output a slave current according to the stored voltage value, wherein a range of the slave current is controlled by the current range control signal; and a master/slave selection circuit configured to output one of the master current and the slave current as a data current according to a master/slave selection signal.

2. The data driver of claim 1, wherein the adjusted data current value is proportional to the multiplexed data current value, and wherein a proportionality constant is determined by the current range control signal.

3. The data driver of claim 1, wherein the master circuit comprises:

a sample and hold circuit configured to selectively store a gate voltage from the first transistor according to the master sample and hold control signal, and to maintain the stored gate voltage;

an output mirror circuit configured to output a plurality of first currents corresponding to the gate voltage stored in the sample and hold circuit; and a switching circuit configured to selectively supply the plurality of first currents according to the current range control signal, and to output a sum of the supplied first currents as a master current.

4. The data driver of claim 3, wherein the sample and hold circuit comprises:

a first switch configured to selectively supply a voltage corresponding to the gate voltage of the first transistor according to the master sample and hold control signal; and a first capacitor configured to maintain the supplied voltage.

5. The data driver of claim 4, wherein the output mirror circuit comprises a plurality of second transistors, wherein gates of the plurality of second transistors are connected to the first capacitor, wherein sources of the plurality of second transistors are connected to a source of the first transistor, and wherein the plurality of second transistors are configured to output the plurality of first current values to their drains.

6. The data driver of claim 3, wherein the switching circuit comprises a plurality of fourth transistors, wherein the plurality of first currents are supplied to sources of the plurality of fourth transistors, wherein the current range control signal is supplied to gates of the plurality of fourth transistors, and wherein drains of the plurality of fourth transistors are coupled to each other to output the master current.

7. The data driver of claim 3, wherein the switching circuit comprises a plurality of fourth transistors, wherein the plurality of first currents are supplied to sources of the plurality of fourth transistors, wherein a predetermined voltage is supplied to a gate of any one transistor of the plurality of fourth transistors so as to be in an ON-state, wherein the current range control signal is supplied to gates of the other fourth transistors, and wherein drains of the plurality of fourth transistors are connected to each other to output the master current.

8. The data driver of claim 1, wherein the slave circuit comprises:

a slave sample and hold circuit configured to selectively store a voltage corresponding to a gate voltage of the first transistor according to the slave sample and hold control signal, and to maintain the gate voltage;

an output mirror circuit configured to output a plurality of first currents corresponding to the gate voltage stored in the sample and hold circuit; and a switching circuit configured to selectively supply the plurality of first currents according to the current range control signal, and to output a sum of the supplied first currents as a slave current.

9. An organic light emitting display comprising:

a scan driver configured to sequentially supply a scan signal to a plurality of scan lines;

a data driver configured to supply a data current to a plurality of data lines, wherein the data driver comprises a shift register configured to output a latch control signal according to a clock signal and a synchronous signal, a data latch configured to sequentially receive video data according to the latch control signal, and to output the video data in parallel, a multiplexer configured to multiplex the parallel video data, a digital-to-analog (D/A) converter configured to convert the multiplexed video data to multiplexed analog current, and to output multiplexed data current, and a current range control circuit configured to receive the multiplexed data current from the D/A converter and to output demultiplexed data current, wherein the current range control circuit is further configured to adjust a range of the data current according to a current range control signal, the current range control circuit comprising:

an input minor circuit comprising a first transistor, wherein a drain of the first transistor is coupled to a gate of the first transistor, and wherein the multiplexed data current is drawn from the drain of the first transistor;

a master circuit configured to store a voltage from the gate of the first transistor according to a master sample and hold control signal, and to output a master current corresponding to the stored voltage value, wherein a range of the master current is controlled by the current range control signal;

a slave circuit configured to store a voltage from the gate of the first transistor according to a slave sample and hold control signal, and to output a slave current according to the stored voltage value, wherein a range of the slave current is controlled by the current range control signal; and a master/slave selection circuit configured to output one of the master current and the slave current as a data current according to a master/slave selection signal; and a pixel portion configured to display an image according to the data current supplied to the plurality of data lines and the scan signal supplied to the plurality of scan lines.

* * * * *

UNITED STATES PATENT AND TRADEMARK OFFICE

CERTIFICATE OF CORRECTION

PATENT NO. : 7,362,249 B2
APPLICATION NO. : 11/283543
DATED : April 22, 2008
INVENTOR(S) : Kim et al.

It is certified that error appears in the above-identified patent and that said Letters Patent is hereby corrected as shown below:

At column 10, line 28, in Claim 9, delete “minor” and insert -- mirror --, therefor.

Signed and Sealed this

Twenty-first Day of October, 2008

JON W. DUDAS
*Director of the United States Patent and Trademark Office*